United States Patent
Zhao et al.

(10) Patent No.: US 10,043,916 B2
(45) Date of Patent: Aug. 7, 2018

(54) THIN-FILM TRANSISTOR HAVING CHANNEL STRUCTURE WITH INCREASED WIDTH-LENGTH RATIO

(71) Applicants: BOE TECHNOLOGY GROUP CO., LTD., Beijing (CN); HEFEI BOE OPTOELECTRONICS TECHNOLOGY CO., LTD., Hefei, Anhui (CN)

(72) Inventors: Na Zhao, Beijing (CN); Xufei Xu, Beijing (CN); Gaofei Shi, Beijing (CN)

(73) Assignees: BOE TECHNOLOGY GROUP CO., LTD., Beijing (CN); HEFEI BOE OPTOELECTRONICS TECHNOLOGY CO., LTD., Hefei, Anhui (CN)

( * ) Notice: Subject to any disclaimer, the term of this patent is extended or adjusted under 35 U.S.C. 154(b) by 0 days.

(21) Appl. No.: 14/913,160

(22) PCT Filed: Jul. 28, 2015

(86) PCT No.: PCT/CN2015/085281
§ 371 (c)(1),
(2) Date: Feb. 19, 2016

(87) PCT Pub. No.: WO2016/123931
PCT Pub. Date: Aug. 11, 2016

(65) Prior Publication Data
US 2016/0351724 A1    Dec. 1, 2016

(30) Foreign Application Priority Data

Feb. 6, 2015    (CN) .......................... 2015 1 0063966

(51) Int. Cl.
*H01L 29/10* (2006.01)
*H01L 29/76* (2006.01)
(Continued)

(52) U.S. Cl.
CPC .. *H01L 29/78696* (2013.01); *H01L 21/28158* (2013.01); *H01L 21/31144* (2013.01);
(Continued)

(58) Field of Classification Search
CPC ......... H01L 29/78696; H01L 21/28158; H01L 29/42384; H01L 2029/42388
(Continued)

(56) References Cited

U.S. PATENT DOCUMENTS 6,355,532 B1    3/2002    Seliskar et al.
6,600,197 B1 *  7/2003    Nakajima ............. H01L 21/266
                                                         257/352
(Continued)

FOREIGN PATENT DOCUMENTS

CN    101228619 A    7/2008
CN    102437196 A    5/2012
(Continued)

OTHER PUBLICATIONS

International Search Report and Written Opinion (including English translation of Box V.) dated Oct. 9, 2015 for corresponding PCT Appln. No. PCT/CN2015/085281.
(Continued)

*Primary Examiner* — Lex Malsawma
*Assistant Examiner* — Eric W Jones
(74) *Attorney, Agent, or Firm* — Kinney & Lange, P.A.

(57) ABSTRACT

Embodiments of the invention disclose a thin-film transistor having a channel structure that has an increased width-length ratio and a manufacturing method thereof, a display substrate and a display device. The thin-film transistor comprises a gate, a gate insulation layer and an active layer stacked on a substrate, the active layer is formed therein with a source region, a drain region and a channel region, a surface of the active layer facing the gate insulation layer is (Continued)

at least partially formed with a non-planar surface in the channel region, such that the non-planar surface of the active layer has a tortuous shape in a width direction of the channel region.

7 Claims, 5 Drawing Sheets

(51) Int. Cl.
| | |
|---|---|
| H01L 31/036 | (2006.01) |
| H01L 31/112 | (2006.01) |
| H01L 29/786 | (2006.01) |
| H01L 21/28 | (2006.01) |
| H01L 21/311 | (2006.01) |
| H01L 27/12 | (2006.01) |
| H01L 29/423 | (2006.01) |

(52) U.S. Cl.
CPC .......... *H01L 27/1288* (2013.01); *H01L 29/10* (2013.01); *H01L 29/42384* (2013.01); *H01L 29/786* (2013.01); *H01L 2029/42388* (2013.01)

(58) Field of Classification Search
USPC .......... 257/40, 59, 72, 49, 66; 438/147, 151
See application file for complete search history.

(56) References Cited

U.S. PATENT DOCUMENTS

| | | | | |
|---|---|---|---|---|
| 7,504,694 | B2* | 3/2009 | Tseng | ................ H01L 29/41733 257/347 |
| 2005/0041169 | A1 | 2/2005 | Hashimoto et al. | |
| 2006/0151790 | A1 | 7/2006 | Kang et al. | |
| 2010/0320453 | A1* | 12/2010 | Tanaka | ................ H01L 51/0558 257/40 |
| 2011/0147756 | A1* | 6/2011 | Moriguchi | ........ H01L 29/78609 257/60 |
| 2013/0009161 | A1* | 1/2013 | Himori | ............... H01L 51/0558 257/60 |
| 2014/0054583 | A1* | 2/2014 | Uemura | .............. H01L 29/7869 257/43 |
| 2015/0102338 | A1* | 4/2015 | Kong | ................ H01L 29/42384 257/43 |

FOREIGN PATENT DOCUMENTS

| | | | |
|---|---|---|---|
| CN | 202282354 | U | 6/2012 |
| CN | 102945807 | A | 2/2013 |
| CN | 103199112 | A | 7/2013 |
| CN | 103762218 | A | 4/2014 |
| CN | 103824780 | A | 5/2014 |
| CN | 104576761 | A | 4/2015 |
| JP | S62128177 | A | 6/1987 |
| JP | H07321129 | A | 12/1995 |
| KR | 100764273 | B1 | 10/2007 |
| KR | 20090041061 | A * | 4/2009 |

OTHER PUBLICATIONS

First Chinese Office Action, for Chinese Patent Application No. 201510063966.4, dated Apr. 5, 2017, 12 pages.
Extended European Search Report dated Jul. 14, 2017, for corresponding European Application No. 15832664.5.
Second Chinese Office Action, for Chinese Patent Application No. 201510063966.4, dated Dec. 4, 2017, 16 pages.

* cited by examiner

THIN-FILM TRANSISTOR HAVING CHANNEL STRUCTURE WITH INCREASED WIDTH-LENGTH RATIO

CROSS-REFERENCE TO RELATED APPLICATION

This application is a Section 371 National Stage application of International Application No. PCT/CN2015/085281, filed on 28 Jul. 2015, entitled "Thin-Film Transistor And Manufacturing Method Thereof, Display Substrate And Display Device", which has not yet been published, which claims priority to Chinese Application No. 201510063966.4, filed on 6 Feb. 2015, incorporated herein by reference in their entirety.

BACKGROUND OF THE INVENTION

Field of the Invention

Embodiments of the invention generally relate to the field of display technologies, and specifically, to a thin-film transistor having a channel structure having an increased width-length ratio and a manufacturing method thereof, a display substrate and a display device.

Description of the Related Art

With continuous development of liquid crystal display technologies, thin-film transistors (TFTs) are widely used in display devices, such as TFT LCDs (liquid crystal displays). In a TFT LCD, luminance of a subpixel is adjusted through controlling a voltage on each of subpixels arranged in an array, and thereby a complete and accurate display image is achieved. When a turn-on voltage Von is applied to gate electrodes in a certain row in the array so that the TFT device is turned on, a source and a drain located at both sides of a TFT channel are communicated with each other, and a given signal is applied on a subpixel electrode through a data line. A voltage difference between the subpixel electrode and a common electrode determines a deflection state of liquid crystal molecules in region of this subpixel, and finally, affects luminance and display performance of the subpixel.

Improvement of quality of display image of a LCD has become one focus of competition among LCD products. A value of the turn-on voltage directly determines the quality of the display image, such that an important aspect of research is to increase an on-current Ion of the TFT. Aperture ratio is also an important factor among factors that affect the luminance of the display image. Aperture ratio is a ratio between an area of a light transmitting region of a subpixel except wires, transistors and the like thereof (for example, hidden by a black matrix) and an entire area of the subpixel. The higher the aperture ratio, the higher a light transmitting efficiency is. When light is emitted from a backlight unit, not all the light can pass through the panel. For example, the light may be blocked by signal wires for source driver chip and gate driver chip of the LCD, the TFT itself, a region where a storage capacitor for storage voltage is located, or the like. Besides of these regions being not entirely transparent, light passing through these regions cannot be controlled by a voltage such that these regions cannot display a proper gray level. Thus, all these regions should be shielded by a black matrix to prevent them from interfering with other light transmitting regions. A ratio between an effective light transmitting region and the entire area of the panel is called as the aperture ratio. Therefore, the quality of the display image can be significantly improved through reducing the size of the TFT, increasing on-current of the TFT, or the like.

Another important factor that affects the on-current of a thin-film transistor is a width-length ratio (W/L) of the transistor. FIGS. 1 and 2 schematically show a structure of a thin-film transistor. As shown in the figures, the thin-film transistor comprises a gate 11, a gate insulation layer 12 and an active layer 13 stacked on a substrate 10, the active layer 13 may also be covered with a passivation layer 14. The active layer 13 is formed therein with a source (S) region, a drain (D) region, and a channel region between the source region and the drain region. In the thin-film transistor shown in FIGS. 1 and 2, the channel structure thereof is a planar structure, that is, a surface of the active layer facing toward the gate is flat or substantially flat at least in the channel region. Thus, a length L and a width W of the channel region of such thin-film transistor are defined by the source region and the drain region, and are generally limited by manufacturing processes, such as a minimum size of photoetching process. Usually, reducing the minimum size of photoetching process to reduce the length L and in turn increase the width-length ratio W/L of the channel region is difficult.

SUMMARY OF THE INVENTION

This invention is provided to solve at least one of the above and other technical questions and defects in prior arts.

According to one aspect of the invention, there is provided a thin-film transistor.

According to an exemplary embodiment, the thin-film transistor comprises a gate, a gate insulation layer and an active layer stacked on a substrate, the active layer is formed therein with a source region, a drain region and a channel region, a surface of the active layer facing the gate insulation layer is at least partially formed with a non-planar surface in the channel region, such that the non-planar surface of the active layer has a tortuous shape in a width direction of the channel region.

According to a further embodiment, the tortuous shape may comprise a first concave-and-convex structure.

According to a further embodiment, the first concave-and-convex structure may comprise ridges and troughs arranged alternately in the width direction of the channel region and extending in a length direction of the channel region.

According to a further embodiment, a surface of the gate insulation layer facing the active layer may be formed with a second concave-and-convex structure in a region corresponding to the channel region, and the second concave-and-convex structure has a shape matching the shape of the first concave-and-convex structure.

According to a further embodiment, the active layer may have a constant thickness in the channel region.

According to a further embodiment, a surface of the active layer facing away from the gate insulation layer may be formed with a third concave-and-convex structure in the channel region, the third concave-and-convex structure being consistent with the first concave-and-convex structure.

According to a further embodiment, a surface of the gate facing the gate insulation layer may be formed with a fourth concave-and-convex structure in a region corresponding to the channel region, the fourth concave-and-convex structure is consistent with the first concave-and-convex structure.

According to a further embodiment, the gate insulation layer has a constant thickness in the region corresponding to the channel region.

According to another aspect of the invention, there is provided a method of manufacturing a thin-film transistor.

According to an exemplary embodiment, the method comprises the following steps of:

forming a gate on a substrate;

forming a gate insulation layer on the substrate to at least cover the gate;

forming a non-planar surface in a surface of the gate insulation layer facing away from the gate in a region of the surface corresponding to a channel region of the thin-film transistor; and forming an active layer on the gate insulation layer, such that a surface of the active layer facing the gate insulation layer is formed with a non-planar surface, which is located in the channel region and matches the shape of the non-planar surface of the gate insulation layer, and the non-planar surface of the active layer has a tortuous shape in a width direction of the channel region.

According to a further embodiment, the step of forming the non-planar surface of the gate insulation layer may comprise: forming a concave-and-convex structure in the surface of the gate insulation layer facing away from the gate in the region corresponding to the channel region of the thin-film transistor.

According to a further embodiment, the step of forming the concave-and-convex structure may comprise: forming, in the surface of the gate insulation layer facing away from the gate in the region corresponding to the channel region of the thin-film transistor, ridges and troughs arranged alternately in the width direction of the channel region and extending in a length direction of the channel region.

According to a further embodiment, the step of forming the ridges and troughs may comprise: forming a plurality of troughs through a patterning process in the surface of the gate insulation layer facing away from the gate in the region corresponding to the channel region of the thin-film transistor.

According to a further embodiment, the patterning process may comprise the following substeps of:

forming a photoresist layer on the gate insulation layer;

providing a halftone mask, such that a semitransparent portion of the halftone mask is positioned to correspond to the channel region and a completely transparent portion of the halftone mask is positioned to correspond to another region other than the channel region;

photoetching and etching the photoresist layer with the aid of the halftone mask to form a plurality of grooves in a portion of the photoresist layer located in a region corresponding to the channel region, and to form a via hole in a portion of the photoresist layer located in the another region to expose the gate insulation layer;

etching continuously by using the substrate as an etching stop layer to form another via hole in the gate insulation layer at a position corresponding to the via hole in the photoresist layer, and to form the plurality of troughs in the gate insulation layer at positions corresponding to the plurality of grooves; and ashing and removing the photoresist layer.

According to a further embodiment, the active layer may be formed to have a constant thickness in the channel region.

According to a further aspect of the invention, there is provided a method of manufacturing a thin-film transistor.

According to an exemplary embodiment, the method comprises the following steps of: forming a gate on a substrate; forming a non-planar surface in a surface of the gate facing away from the substrate in a region corresponding to a channel region of the thin-film transistor; forming a gate insulation layer on the substrate to at least cover the gate, the gate insulation layer having a constant thickness in a region corresponding to the channel region; and forming an active layer on the gate insulation layer, such that a surface of the active layer facing the gate insulation layer is formed with a non-planar surface, which is located in the channel region and consistent with the non-planar surface of the gate, and the non-planar surface of the active layer has a tortuous shape in a width direction of the channel region. In this aspect, the non-planar surface of the active layer may comprise a concave-and-convex structure, and the concave-and-convex structure may comprise ridges and troughs arranged alternately in the width direction of the channel region and extending in a length direction of the channel region.

According to a still further aspect of the invention, there is provided a method of manufacturing a thin-film transistor.

According to an exemplary embodiment, the method comprises the following steps of: forming an active layer on a substrate; forming a non-planar surface in a surface of the active layer facing away from the substrate in a channel region of the thin-film transistor, such that the non-planar surface of the active layer has a tortuous shape in a width direction of the channel region; forming a gate insulation layer on the substrate to at least cover the active layer; and forming a gate on the gate insulation layer. In this aspect, the non-planar surface of the active layer may comprise a concave-and-convex structure, and the concave-and-convex structure may comprise ridges and troughs arranged alternately in the width direction of the channel region and extending in a length direction of the channel region.

According to an exemplary embodiment of the above method, the tortuous shape of the active layer comprises a concave-and-convex structure.

According to an exemplary embodiment of the above method, the concave-and-convex structure comprises ridges and troughs arranged alternately in the width direction of the channel region and extending in a length direction of the channel region.

According to a still further aspect of the invention, there is provided a display substrate, which comprises: a substrate; and a thin-film transistor formed on the substrate, the thin-film transistor being the thin-film transistor according to any one of the above embodiments or the thin-film transistor being manufactured through the any one of the above methods.

According to a still further aspect of the invention, there is provided a display device, which comprises the above display substrate.

Other objects and advantages of the invention will become obvious and a thorough understanding of the invention will be facilitated with the detailed description set forth hereinafter in conjunction with the attached drawings.

BRIEF DESCRIPTION OF THE DRAWINGS

Features and advantages of the invention will be thoroughly understood with reference to the attached drawings, which should be interpreted as being illustrative rather than limitative to the invention, in which:

FIG. 6A shows a structure formed after a gate and a gate insulation layer are formed on a substrate; FIG. 6B shows a structure formed after a photoresist layer is formed on the structure of FIG. 6A; FIG. 6C shows a structure formed after a first photoetching process is performed to form a recess in a portion of the photoresist layer corresponding to the channel region; FIG. 6D shows a structure formed after a first etching process is performed to form a trough in a portion of the gate insulation layer corresponding to the channel region; FIG. 6E shows a structure formed after the photoresist layer is removed; and FIG. 6F shows a structure formed after an active layer is formed on the structure of FIG. 6E.

DETAILED DESCRIPTION OF PREFERRED EMBODIMENTS OF THE INVENTION

To facilitate introducing the invention, in the following description, many details are set forth to provide a thorough understanding of the embodiments of the invention. Obviously, however, one or more embodiments can also be implemented without these details. In other circumstances, well-known structures and devices are schematically illustrated to simplify the drawings.

According to a general concept of the invention, there is provided a thin-film transistor comprising a gate, a gate insulation layer and an active layer stacked on a substrate, the active layer is formed therein with a source region, a drain region and a channel region, wherein a surface of the active layer facing the gate insulation layer is at least partially formed with a non-planar surface in the channel region, such that the non-planar surface of the active layer has a tortuous shape in a width direction of the channel region.

Figure 1:
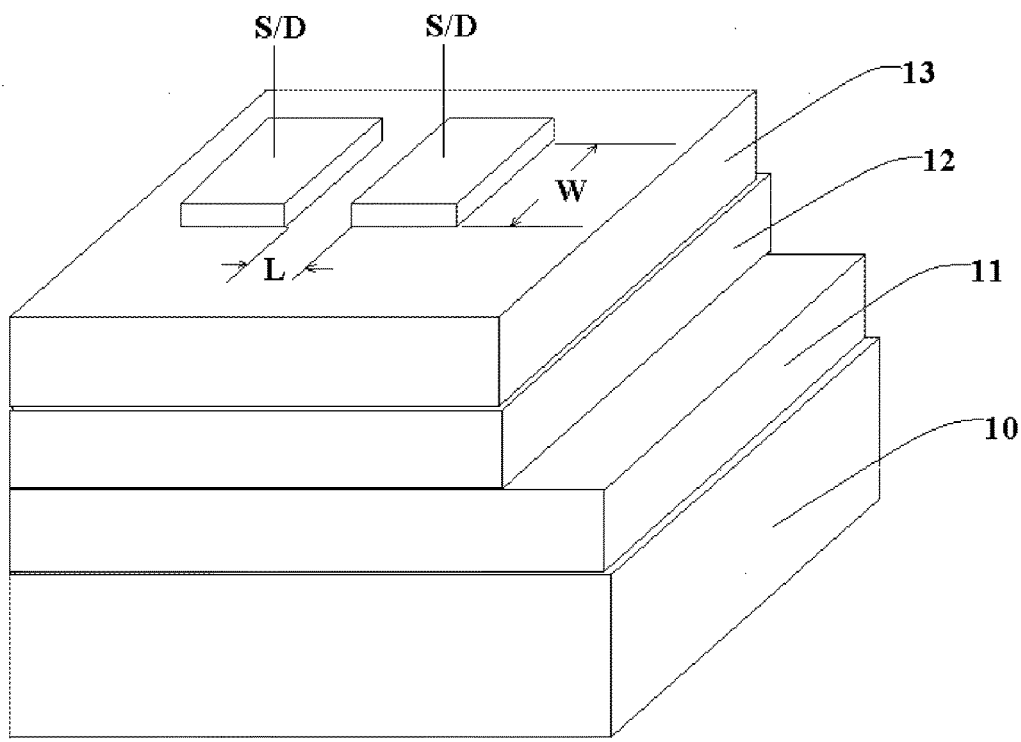
FIG. 1 is a perspective view schematically showing a partial sectional structure of an existing thin-film transistor.
Figure 2:
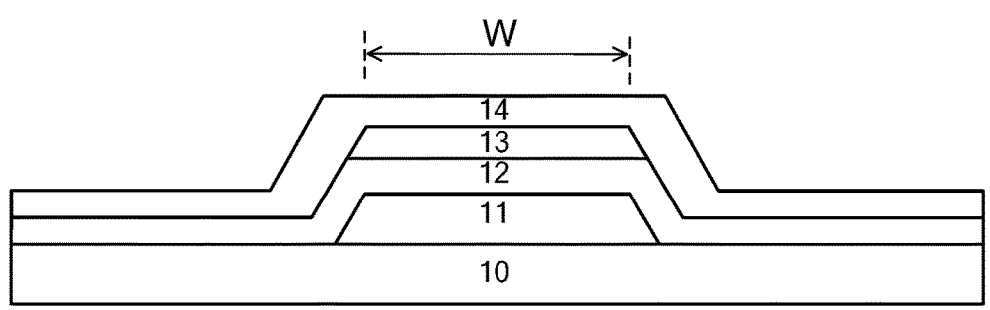
FIG. 2 is a cross sectional view taken in a width direction of a channel region of the thin-film transistor shown in FIG. 1.
Figure 3:
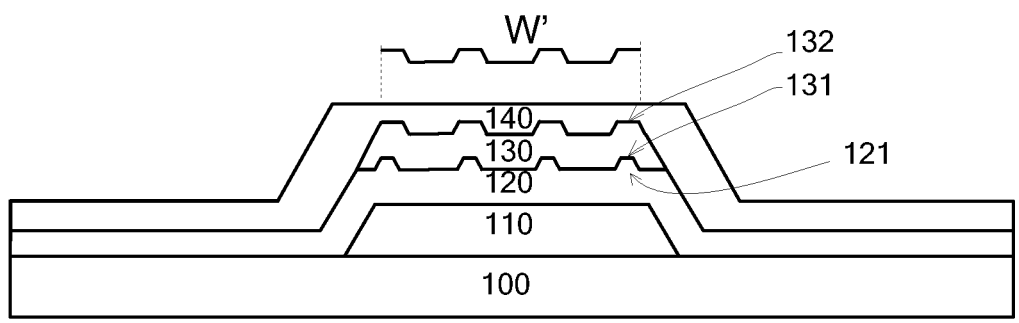
FIG. 3 is a cross sectional view schematically showing a structure of a thin-film transistor according to one exemplary embodiment of the invention.

FIG. 3 schematically shows a structure of a thin-film transistor according to one exemplary embodiment of the invention. As shown, the thin-film transistor according to this embodiment comprises a gate 110, a gate insulation layer 120 and an active layer 130 stacked on a substrate 100, the active layer 130 is formed therein with a source region, a drain region (not shown in FIG. 3) and a channel region. In an example, the active layer 130 may be covered by a protective passivation layer 140.

A surface of the active layer 130 facing the gate insulation layer 120 is at least partially formed with a non-planar surface in the channel region, such that the non-planar surface of the active layer has a tortuous shape in a width direction of the channel region. In the embodiment shown in FIG. 3, the surface of the active layer 130 facing the gate insulation layer 120 is formed with a first concave-and-convex structure 131, such that the channel region of the thin-film transistor is tortuous in the width direction (the left-right direction in FIG. 3). As compared with a width W of a channel of a conventional thin-film transistor, an increased width W' is provided. Thus, a width-length ratio of the thin-film transistor can be efficiently increased, an on-current of the thin-film transistor is increased, and power consumption is reduced. In the circumstance that the thin-film transistor according to the embodiment of the invention and the conventional thin-film transistor have the same width-length ratio, since an effective width of the channel of the thin-film transistor according to the embodiment of the invention is increased, a length of the channel may be reduced, such that an area of the thin-film transistor may be reduced, and in turn, an aperture ratio of a display device can be increased.

As shown in FIG. 3, the first concave-and-convex structure 131 may comprise ridges and troughs arranged alternately in the width direction of the channel region and extending in the length direction (a direction perpendicular to the page in FIG. 3) of the channel region. It can be understood that, the non-planar channel structure of the invention is not limited to the concave-and-convex structure 131, and it can also be a curved structure, a step-shaped structure, a recessed structure, a sawtooth structure, or the like. The concave-and-convex structure 131 may also comprises other shapes, such as protrusions or bulges formed on the surface of the gate insulation layer facing the active layer.

As shown in FIG. 3, the surface of the gate insulation layer 120 facing the active layer 130 is formed with a second concave-and-convex structure 121 located in a region corresponding to the channel region and matching with the first concave-and-convex structure 131. Exemplarily, the second concave-and-convex structure 121 comprises troughs correspondingly formed at positions where the ridges of the first concave-and-convex structure 131 are located and ridges correspondingly formed at positions where the troughs of the first concave-and-convex structure 131 are located.

As will be described hereinafter, the concave-and-convex structure 121 may be formed on the gate insulation layer 120 first, then the active layer 130 is formed on the gate insulation layer, for example, through a deposition process. Thus, the concave-and-convex structure 131 can be formed in the surface of the active layer 130 facing the gate insulation layer 120 to match with the shape of the concave-and-convex structure 121, without any extra process. In this circumstance, a surface of the active layer 130 facing away from the gate insulation layer 120 may be formed with a third concave-and-convex structure 132 consistent with the concave-and-convex structure 131 in the channel region, concave-and-convex structure 131 having ridges and troughs arranged alternately in the width direction of the channel region and extending in the length direction of the channel region, each ridge and trough being connected to each other by slanted portions, and concave-and-convex structures 132 having ridges and troughs arranged alternately in the width direction of the channel region and extending in the length direction of the channel region, each ridge and trough being connected to each other by slanted portions, such that the active layer 130 has a substantially uniform or constant thickness in the channel region, which is advantageous to increase the on-current and to improve uniformity of the current.

Figure 4:
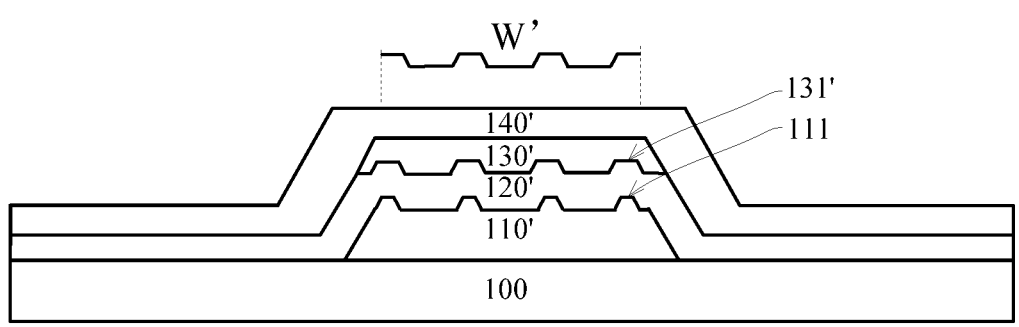
FIG. 4 is a cross sectional view schematically showing a structure of a thin-film transistor according to another exemplary embodiment of the invention.
Figure 5:
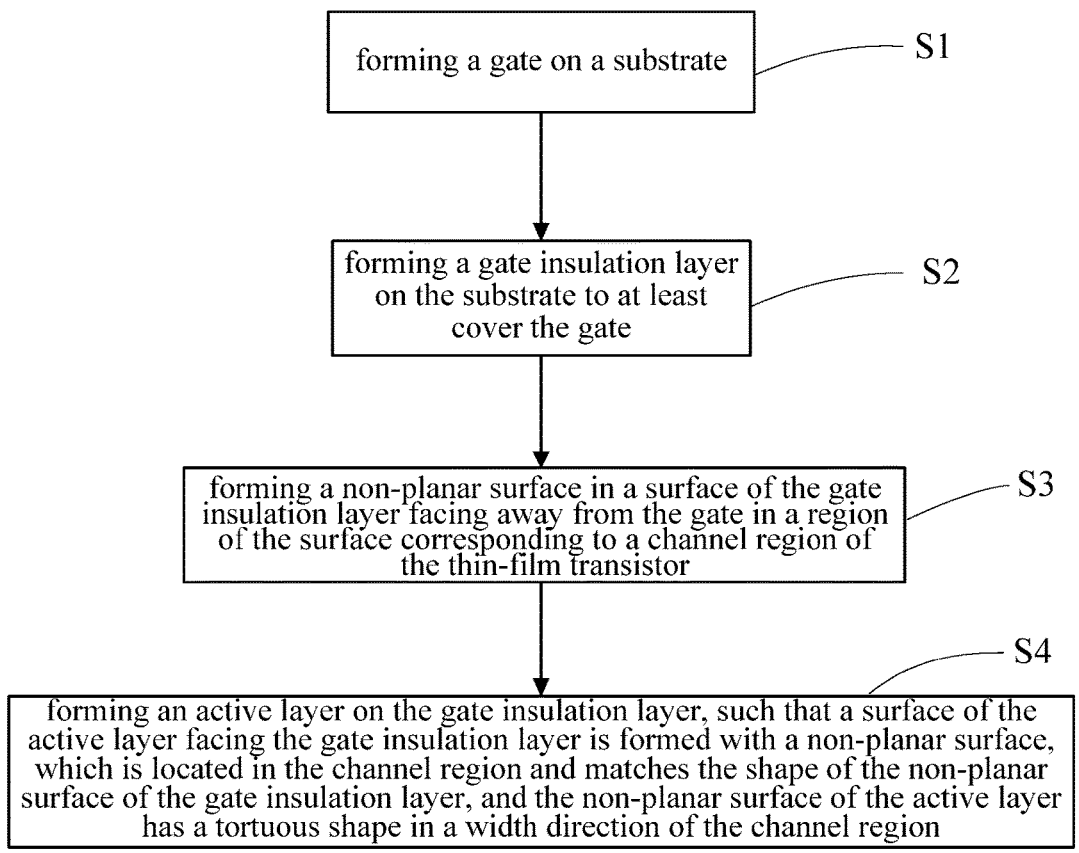
FIG. 5 is an illustrative flow chart of a method of manufacturing a thin-film transistor according to one exemplary embodiment of the invention.

FIG. 4 schematically shows a structure of a thin-film transistor according to another exemplary embodiment of the invention. In FIG. 4, the surface of the active layer 130' facing the gate insulation layer 120' is formed with a similar concave-and-convex structure 131', such that the channel region of the thin-film transistor is tortuous in the width direction (the left-right direction in FIG. 4), so as to provide an increased channel width W'. The embodiment shown in FIG. 4 differs from that shown in FIG. 3 in that a concave-and-convex structure 111 consistent with the concave-and-convex structure 131' is formed on the surface of the gate 110' facing the gate insulation layer 120' in a region corresponding to the channel region. In this circumstance, the corresponding concave-and-convex structure 131' can be easily formed on the surface of the active layer 130' facing the gate insulation layer 120' through deposition or thermal growth of the gate insulation layer 120' and the active layer 130' in a shape matching manner.

It can be understood that, for the structures shown in FIGS. 3 and 4, if the active layer formed through a deposition process has a non-uniform thickness, an additional patterning process may be applied to the surface of the active layer facing away from the gate insulation layer, for example, to from a concave-and-convex structure, so as to ensure that the active layer has a substantially uniform thickness in the channel region.

The above is described taking a bottom-gate thin-film transistor as an example, however, the invention is also applicable to a top-gate thin-film transistor, and other MOS transistor may also utilize the non-planar channel structure of the invention to increase its width-length ratio. As described hereinafter, regarding a top-gate thin-film transistor, the non-planar channel structure may be directly formed on the active layer, so as to avoid additional non-planarization process for the gate or the gate insulation layer.

Illustrative flow charts of methods of manufacturing a thin-film transistor according to exemplary embodiments of the invention will be described with reference to FIG. 5 and FIGS. 6A-6F. In the exemplary embodiment shown in FIG. 5, the method of manufacturing a thin-film transistor comprises the following steps of:

S1: forming a gate on a substrate;
S2: forming a gate insulation layer on the substrate to at least cover the gate;
S3: forming a non-planar surface on a surface of the gate insulation layer facing away from the gate in a region corresponding to a channel region of the thin-film transistor; and
S4: forming an active layer on the gate insulation layer, such that a surface of the active layer facing the gate insulation layer is formed with a non-planar surface in the channel region to match the non-planar surface of the gate insulation layer and the non-planar surface of the active layer has a tortuous shape in a width direction of the channel region.

Figure 6A:
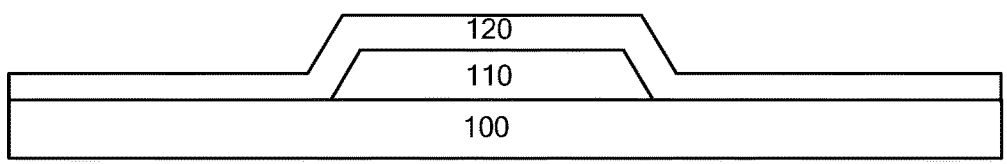
FIGS. 6A to 6F are illustrative drawings showing a method of manufacturing a thin-film transistor according to another exemplary embodiment of the invention, where
Figure 6B:
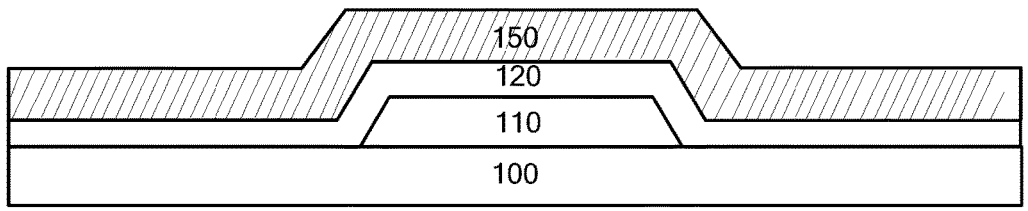

In the method of manufacturing a thin-film transistor according to another exemplary embodiment of the invention shown in FIGS. 6A-6F, firstly, as shown in FIG. 6A, a gate 110 and a gate insulation layer 120 at least covering the gate 110 are formed successively on a substrate 100 such as a glass substrate; then a photoresist layer 150 covering the gate insulation layer 120 is formed, as shown in FIG. 6B.

Figure 6C:
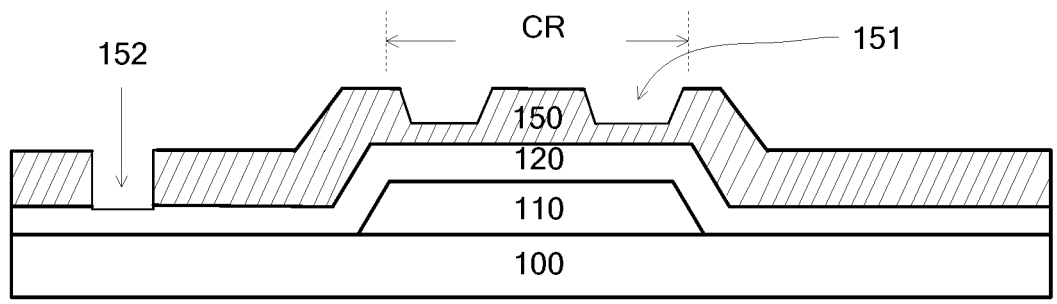

Then, a halftone mask (not shown) is provided. A semi-transparent portion of the halftone mask corresponds to the channel region of the thin-film transistor to be formed, a completely transparent portion of the halftone mask corresponds to another region other than the channel region, such as an output end region of the thin-film transistor or a peripheral region of a display device, and in the meantime, with the aid of the halftone mask, a photoetching process and an etching process are performed on the photoresist layer 150 to form a plurality of grooves 151 in a portion of the photoresist layer 150 located in a region corresponding to the channel region CR, and to form a via hole 152 in a portion of the photoresist layer 150 located in the another region to expose the gate insulation layer 120, as shown in FIG. 6C. In this circumstance, since the above halftone mask is utilized, a depth of the grooves 151 in the photoresist layer 150 in the region corresponding to the channel region may be formed to be smaller than a depth of the via hole 152, i.e., there is residual photoresist in the region corresponding to the channel region CR. The gate insulation layer 120 may be slightly etched through the via hole 152.

Figure 6D:
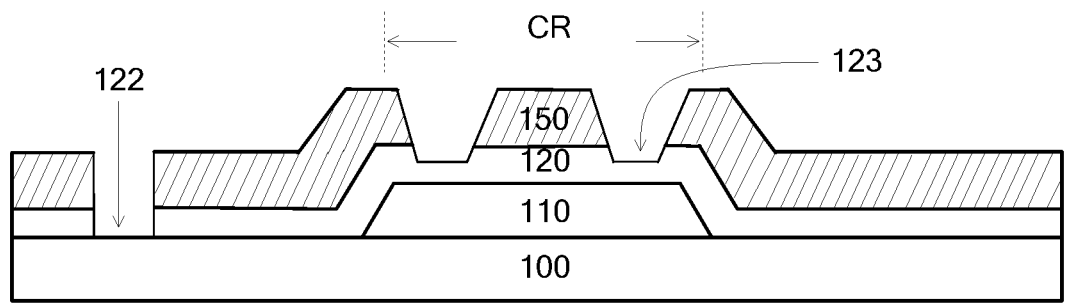
Figure 6E:
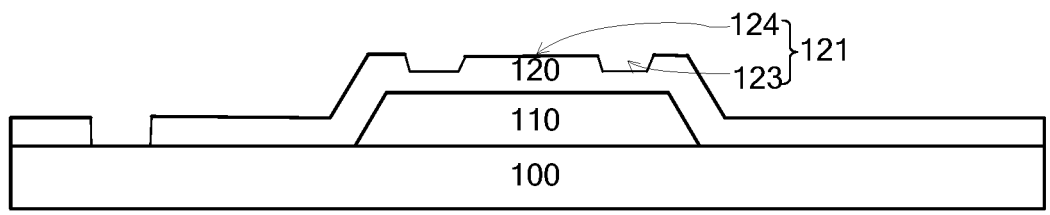

Then, for example, with the substrate 100 being used as an etching stop layer or by using an additional etching stop layer formed between the gate insulation layer 120 and the substrate 110, the gate insulation layer 120 is continuously etched, and the residual photoresist and adjacent gate insulation layer in regions corresponding to the channel region CR are continuously etched, until the substrate is exposed through the via hole 152. In the meantime, another via hole 122 corresponding to the via hole 152 of the photoresist layer is formed in the gate insulation layer 120, and a plurality of troughs 123 corresponding to the plurality of grooves 151 are formed in portions of the gate insulation layer 120 located in the region corresponding to the channel region CR, as shown in FIG. 6D. Thereafter, the residual photoresist is removed through an ashing process to form a structure shown in FIG. 6E, in which a surface of the gate insulation layer 120 facing away from the gate 100 (the surface on which the active layer is to be formed) is formed with a concave-and-convex structure 121 comprising troughs 123 and ridges 124 adjacent thereto. As described above, the troughs 123 and the ridges 124 are arranged alternately in the width direction of the channel region and extending in the length direction of the channel region. It can be understood that, when performing the etching process, the via hole 152 does not need to penetrate through the gate insulation layer, but may only extend in a part of the gate insulation layer, as long as a suitable concave-and-convex structure can be formed in the region corresponding to the channel region.

Figure 6F:
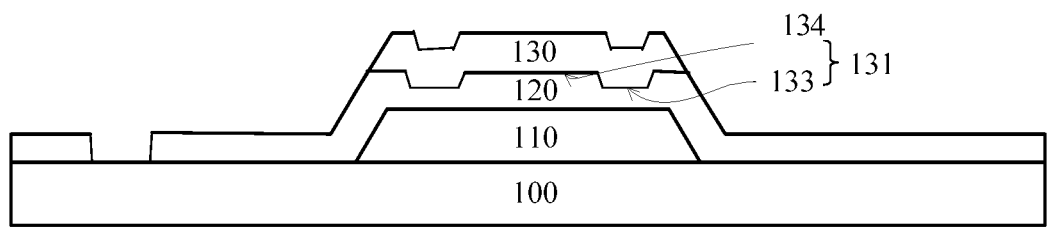

Then, a patterned active layer 130 is formed on the gate insulation layer 120 having the concave-and-convex structure 121 through, for example, a deposition process or other suitable semiconductor processes, and in the meantime, in the channel region of the thin-film transistor, the concave-and-convex structure 131 matching with the concave-and-convex structure 121 in shape is formed on the surface of the active layer 130 facing the gate insulation layer 120, the concave-and-convex structure 131 comprises ridges 133 corresponding to the troughs 123 and troughs 134 corresponding to the ridges 124, as shown in FIG. 6F. In the condition that the active layer 130 is deposited uniformly, the active layer 130 has an uniform thickness in the channel region, and meanwhile, a concave-and-convex structure consistent with the concave-and-convex structure 131 may be formed on the surface of the active layer 130 facing away from the gate insulation layer 120. Finally, a passivation layer (FIGS. 3 and 4) at least covering the formed thin-film transistor may be formed on the substrate 100.

It can be understood that, although the concave-and-convex structure may be formed on the gate insulation layer through using a halftone mask in the exemplary embodiment shown in FIGS. 6A to 6F, the invention is not limited thereto. For example, the surface of the gate insulation layer may be directly etched through utilizing a suitable mask and controlling process parameters, so as to form a desired concave-and-convex structure.

In an example schematically shown in FIGS. 6A to 6F, through forming a concave-and-convex structure on the gate insulation layer, a concave-and-convex structure, i.e. a non-planar channel structure, is formed on the surface of the active layer facing the gate insulation layer in the channel region. Regarding the structure shown in FIG. 4, through forming a concave-and-convex structure on the surface of the gate facing the gate insulation layer in the region corresponding to the channel region, a concave-and-convex structure may also be formed on the surface of the active layer facing the gate insulation layer. In such a manner, the method of manufacturing a thin-film transistor may comprise the following steps of:

forming a gate 110' on a substrate 100;

forming a non-planar surface 111, such as a concave-and-convex structure, in a surface of the gate 110' facing away from the substrate 100 in a region corresponding to the channel region of the thin-film transistor;

forming a gate insulation layer 120' on the substrate 100 to at least cover the gate 110', the gate insulation layer 120' having a constant thickness in the region corresponding to the channel region, such that, in the region corresponding to the channel region, a concave-and-convex structure corresponding to the concave-and-convex structure of the gate 110' is also formed on the surface of the gate insulation layer 120' facing away from the gate 110', and an uniform gate insulation layer may facilitate an on-off control of the channels by the gate; and forming an active layer 130' on the gate insulation layer 120', such that a surface of the active layer 130' facing the gate insulation layer 120' is formed with a non-planar surface such as a concave-and-convex structure 131' consistent with the non-planar surface of the gate 110' in the channel region, so as to form a non-planar channel structure in the width direction of the channel region. As shown in the figures, the concave-and-convex structure 131' may comprise ridges and troughs arranged alternately in the width direction of the channel region and extending in the length direction of the channel region.

Figure 7:
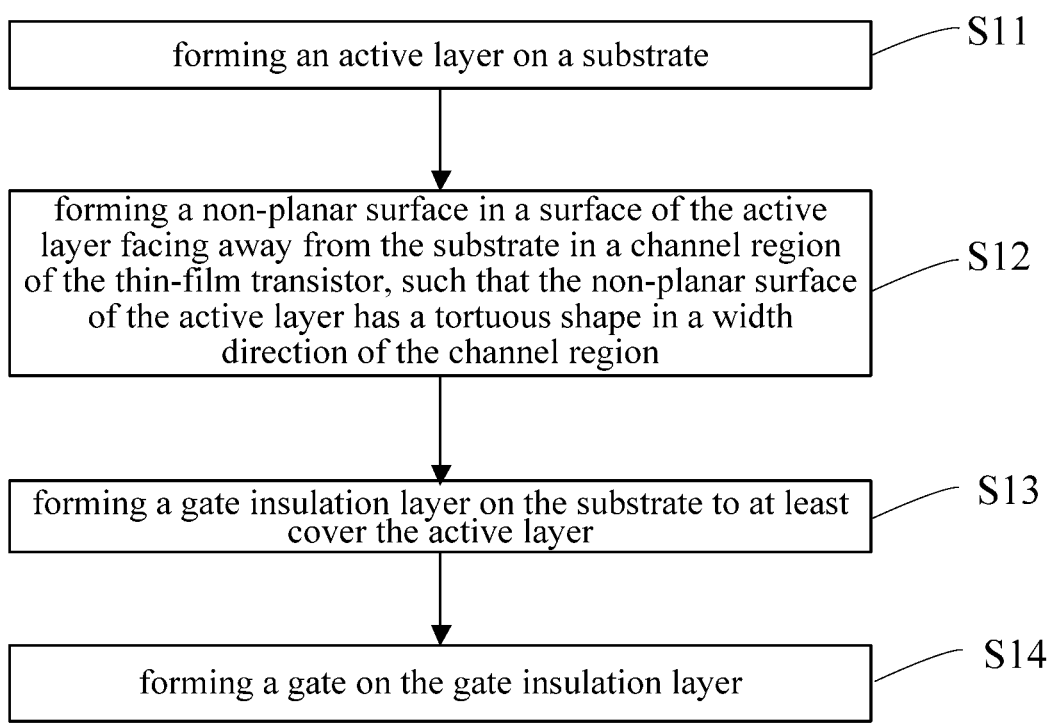
FIG. 7 is an illustrative flow chart showing a method of manufacturing a thin-film transistor according to a further exemplary embodiment of the invention.

It can be seen that, the method of manufacturing a thin-film transistor according to the embodiment of the invention is described taking a bottom-gate thin-film transistor as an example. According to an embodiment of the invention, as shown in FIG. 7, a method of manufacturing a top-gate thin-film transistor may comprises the following steps of:

S11: forming an active layer on a substrate;

S12: forming a non-planar surface in a part of a surface of the active layer facing away from the substrate in the channel region of the thin-film transistor, such that the non-planar surface of the active layer has a tortuous shape in a width direction of the channel region, wherein the non-planar surface may comprises a concave-and-convex structure, which, for example, comprises ridges and troughs arranged alternately in the width direction of the channel region and extending in the length direction of the channel region;

S13: forming a gate insulation layer on the substrate to at least cover the active layer; and S14: forming a gate on the gate insulation layer.

Additionally, embodiments of the invention also provide a display substrate comprising a substrate and a thin-film transistor formed on the substrate, the thin-film transistor is the thin-film transistor as described above or the thin-film transistor manufactured through the method as described above.

Furthermore, embodiments of the invention also provide a display device comprising the display substrate above. Such a display device may comprise a TFT liquid crystal display device, such as a liquid crystal television, a mobile phone, an electronic book, a tablet computer, or the like.

Although embodiments of the invention have been illustrated and described, it may be understood by those skilled in the art that, these embodiments can be modified without departing from the essence and spirit of the invention, therefore, the scope of the invention is defined by the attached claims and their equivalents.

What is claimed is:

1. A thin-film transistor, comprising a gate, a gate insulation layer and an active layer stacked on a substrate, the active layer being formed therein with a source region, a drain region and a channel region between the source region and the drain region, the channel region having a length direction extending from the source region to the drain region and perpendicular to the source region and the drain region, and a width direction extending in parallel with the source region and the drain region in perpendicular to the length direction, wherein a bottom surface of the active layer in surface-to-surface contact with a top surface of the gate insulation layer is at least partially formed with a non-planar surface in the channel region, such that the non-planar surface of the active layer has a tortuous shape in the width direction of the channel region, wherein:

the tortuous shape of the active layer comprises a first concave-and-convex structure that comprises first ridges and first troughs arranged alternately in the width direction of the channel region and extending in the length direction of the channel region and being connected to each other by first slanted portions;

the top surface of the gate insulation layer in surface-to-surface contact with the bottom surface of the active layer is formed with a second concave-and-convex structure in a region corresponding to the channel region, the second concave-and-convex structure having second ridges and second troughs arranged alternately in the width direction of the channel region and extending in the length direction of the channel region and being connected to each other by second slanted portions, a shape of the second concave-and-convex structure matching the shape of the first concave-and-convex structure; and a top surface of the active layer opposite to the bottom surface of the active layer is formed with a third concave-and-convex structure in the channel region, the third concave-and-convex structure having third ridges and third troughs arranged alternately in the width direction of the channel region and extending in the length direction of the channel region and being connected by third slanted portions, and being consistent with the first and second concave-and-convex structures, such that a thickness of the active layer between the second ridges and the third ridges and between the second troughs and the third troughs is uniform.

2. The thin-film transistor according to claim 1, wherein a top surface of the gate in surface-to-surface contact with a bottom surface of the gate insulation layer is formed with a fourth concave-and-convex structure in a region corresponding to the channel region, the fourth concave-and-convex structure being consistent with the first concave-and-convex structure.

3. A display substrate, comprising:
a substrate; and
a thin-film transistor formed on the substrate, the thin-film transistor being the thin-film transistor according to claim 1.

4. A display device, comprising the display substrate according to claim 3.

5. A method of manufacturing a thin-film transistor, comprising:

forming a gate on a substrate;

forming a gate insulation layer on the substrate to at least cover a top surface of the gate;

forming a first concave-and-convex structure, having first ridges and first troughs arranged alternately in the width direction of the channel region and extending in the length direction of the channel region and being connected to each other by first slanted portions, in a top surface of the gate insulation layer opposite to a bottom surface of the gate insulation layer in surface-to-surface contact with the top surface of the gate in a region corresponding to a channel region of the thin-film transistor, the channel region being located between a source region and a drain region and having a length direction extending from the source region to the drain region and perpendicular to the source region and the drain region, and a width direction extending in parallel with the source region and the drain region and perpendicular to the length direction; and forming an active layer on the top surface of the gate insulation layer, such that a bottom surface of the active layer in surface-to-surface contact with the top surface of the gate insulation layer is formed with a tortuous shape in the width direction of the channel region that comprises a second concave-and-convex structure having second ridges and second troughs arranged alternately in the width direction of the channel region and extending in the length direction of the channel region and being connected to each other by second slanted portions, which matches the shape of the first concave-and-convex structure of the gate insulation layer, and such that a top surface of the active layer is formed with a tortuous shape in the width direction of the channel region that comprises a third concave-and-convex structure having third ridges and third troughs arranged alternately in the width direction of the channel region and extending in the length direction of the channel region and being connected to each other by third slanted portions, the third concave-and-convex structure being consistent with the first and second concave-and-convex structures;

wherein a thickness of the active layer between the second ridges and the third ridges and between the second troughs and the third troughs is uniform.

6. The method according to claim 5, wherein forming the first ridges and first troughs comprises:

forming the first troughs through a patterning process in the top surface of the gate insulation layer in the region corresponding to the channel region of the thin-film transistor.

7. The method according to claim 6, wherein the patterning process comprises:

forming a photoresist layer on the top surface of the gate insulation layer;

providing a halftone mask, such that a semitransparent portion of the halftone mask is positioned to correspond to the channel region and a completely transparent portion of the halftone mask is positioned to correspond to another region other than the channel region;

photoetching and etching the photoresist layer with the aid of the halftone mask to form a plurality of grooves in a portion of the photoresist layer located in a region corresponding to the channel region, and to form a via hole in a portion of the photoresist layer located in the another region to expose the gate insulation layer;

etching continuously by using the substrate as an etching stop layer to form another via hole in the gate insulation layer at a position corresponding to the via hole in the photoresist layer, and to form the first troughs in the top surface the gate insulation layer at positions corresponding to the plurality of grooves; and ashing and removing the photoresist layer.

* * * * *